United States Patent
Frade et al.

(10) Patent No.: US 8,706,052 B1
(45) Date of Patent: Apr. 22, 2014

(54) PORTABLE WIDEBAND ANTENNA-RADIATED SIGNAL GENERATOR

(75) Inventors: Richard S. Frade, Lakeville, MA (US); Kenneth White, Wakefield, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 186 days.

(21) Appl. No.: 13/167,935

(22) Filed: Jun. 24, 2011

(51) Int. Cl.
*H04B 1/40* (2006.01)

(52) U.S. Cl.
USPC ....... 455/76; 455/165.1; 455/183.1; 455/255; 455/260

(58) Field of Classification Search
USPC ............... 455/76, 165.1, 260, 255, 95, 183.1, 455/313, 230, 98–100; 327/100, 105
See application file for complete search history.

(56) References Cited

U.S. PATENT DOCUMENTS

| | | | |
|---|---|---|---|
| 7,302,237 B2 * | 11/2007 | Jackson et al. | 455/76 |
| 7,369,598 B2 * | 5/2008 | Fontana et al. | 375/130 |
| 7,826,540 B2 * | 11/2010 | Melick et al. | 375/259 |

* cited by examiner

*Primary Examiner* — Pablo Tran
(74) *Attorney, Agent, or Firm* — James M. Kasischke; Jean-Paul A. Nasser; Michael P. Stanley

(57) ABSTRACT

A portable wideband harmonic signal generator includes circuitry for generating a signal having a selected fundamental frequency, for producing a signal having a harmonic series of the selected fundamental frequency, for transferring the signal having the harmonic series using a balanced impedance output, and for directionally transmitting transferred signal having the harmonic series using a directional antenna having a characteristic impedance that is matched to the balanced impedance output. There is thus provided a compact, efficient transmitter and antenna assembly for transmitting a wideband signal.

13 Claims, 4 Drawing Sheets

PORTABLE WIDEBAND ANTENNA-RADIATED SIGNAL GENERATOR

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

None.

BACKGROUND OF THE INVENTION (1) Field of the Invention

The present invention relates to high frequency communications and is directed more particularly to a design for a portable wideband antenna-radiated signal generator.

(2) Description of the Prior Art

Often, personnel such as EM (electromagnetic) and communication engineers/technicians require a test signal to be generated in order to perform continuity tests of an RF (radio frequency) transmission path through an antenna that is coupled to a receiver. To perform such tests, the personnel are often required to carry relatively expensive, sensitive, large, and heavy test equipment that inconveniently rely upon line power. The testing is especially even more problematic when operating on vessel platforms such as submarines where personnel are required to carry the test equipment through the submarine sail to conduct the test. Commonly encountered difficulties encountered while performing the tests include requirements that personnel must carry heavy and bulky test equipment, that expensive equipment be available, procedures that entail long test setup and breakdown times, and the need for ship power to power the test equipment.

In the prior art, wideband signal generation is addressed:

In Telewski (U.S. Pat. No. 3,777,271), a step recovery diode is driven by two or more frequencies to form a harmonic generator.

In McEwan (U.S. Pat. No. 5,274,271), an output pulse generator for wideband applications is disclosed.

In Nelson et al. (U.S. Pat. No. 5,369,373) the step recovery diode 14 is disclosed that is driven by a sine-wave oscillator 12. In response, a wideband series of harmonics of the fundamental frequency is produced by frequency oscillator 12. The output of the step recovery diode 14 is supplied to one or more bandpass filters or lowpass filters which provide selection windows so that only a specified number of harmonic lines are passed within a selection window.

In Nellson, (U.S. Pat. No. 5,793,309) a short-range electromagnetic transceiver is disclosed in which an oscillator 14 excites a step recovery diode 12. The output of step recovery diode 12 is provided to a filter 24 that acts as a harmonic filter and selects the particular frequency of transmission. The output of filter 24 is gated to produce a short RF pulse which is a harmonic of the input excitation signal and is in the GHz range. The short RF pulse is propagated normal to the circuit and through space until it is dissipated or reflected from a target back into the antenna 20.

As indicated in the references above, a need still exists for an efficient portable wideband antenna-radiated signal generator system design. An additional need exists for an energy efficient method for producing a wideband antenna-radiated signal.

SUMMARY OF THE INVENTION

Accordingly, it is an object of the present invention is to provide a compact high efficiency transmitter and antenna.

It is a further object of the present invention to provide an energy efficient method for producing a non-gated continuous wave wideband antenna-radiated signal. Other objects and advantages of the present invention will be apparent from reading the disclosure herein.

In accordance with the present invention, a portable wideband harmonic signal generator includes circuitry for generating a signal having a selected fundamental frequency, for producing a signal having a harmonic series of the selected fundamental frequency, for transferring the signal having the harmonic series using a balanced impedance output, and for directionally transmitting transferred signal having the harmonic series using a directional antenna having a characteristic impedance that is matched to the balanced impedance output. There is thus provided a compact, efficient transmitter and antenna assembly for transmitting a wideband signal.

The above and other features of the invention, including various novel details of construction and combinations of parts, will now be more particularly described with reference to the accompanying drawings and pointed out in the claims. It will be understood that the particular assembly embodying the invention is shown by way of illustration only and not as a limitation of the invention. The principles and features of this invention may be employed in various and numerous embodiments without departing from the scope of the invention.

BRIEF DESCRIPTION OF THE DRAWINGS

Other objects, features and advantages of the present invention will be apparent with reference to accompanying drawings in which is shown an illustrative embodiment of the invention, wherein corresponding reference characters indicate corresponding parts throughout the several views of the drawings and wherein.

DETAILED DESCRIPTION OF THE INVENTION

Figure 1:
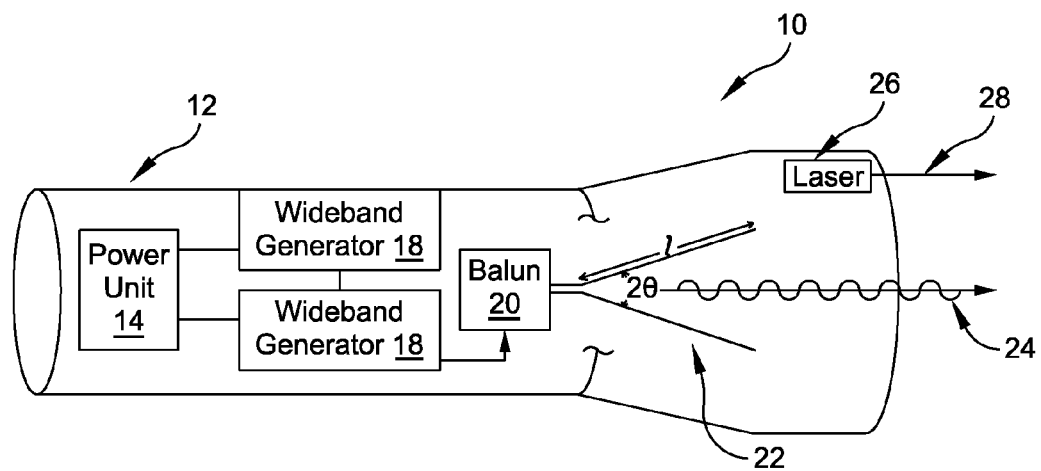
FIG. 1 is a diagram of a system implementing one embodiment of the current invention.

Referring now to the drawings, and more particularly to FIG. 1, a cross-sectional, view of the proximal end and side of an exemplary portable wideband antenna-radiated signal generator is shown and referenced generally by numeral 10. Signal generator 10 includes a housing 12 that is arranged to be easily held in a single hand of a user. Housing 12 encases (and/or otherwise captivates) power unit 14, human interface 16, wideband generator 18, balun 20, antenna 22, and optional laser designator 26. Housing 12 thus provides a common assembly for mounting various components of the signal generator 10.

Power unit 14 includes a power source (such as a battery) and is controllably actuated in response to mechanical actions and/or electrical commands generated human interface 16. For example, initial actuation of power unit 14 causes power to be supplied to wideband generator 18.

The human interface 16 is arranged to allow a user to select operating parameters for controlling wideband generator 18. For example, a user can select a fundamental frequency (from 0 Hz to over 1.5 GHz) for generating a wideband signal (based on the selected fundamental frequency), output power of the wideband generator, output signal harmonic spacing, and operating mode (such as "off," "stand-by," and "normal").

The wideband generator includes (and as discussed further below with respect to FIG. 2) a programmable signal generator for producing a variable fundamental frequency signal. The variable fundamental frequency signal is coupled (directly or indirectly) to a step-recovery diode to produce an output signal that includes series of harmonics.

The output signal is coupled to balun 20 for wideband impendence matching. Balun 20, for example, is a tapered stripline having 50 ohms (unbalanced) input impedance and 20 ohms (balanced) output impedance. A tapered stripline exhibits the characteristic of passing frequencies having wavelengths greater than around twice the length of the tapered portion of the tapered stripline. An example balun is discussed below with reference to FIG. 5 and FIG. 6.

The output of balun 20 is coupled to antenna 22. Antenna 22 is arranged to maximize the efficiency of radiation and directionality of a wideband radiated signal 24 (thus contributing to the overall efficiency of signal generator 10). In an embodiment, antenna 20 is a traveling wave antenna arranged as a "vee" (V-shaped) dipole antenna. Thus, antenna 20 is a passive component that exhibits relatively flat impedance characteristics over a wide range of input frequencies and minimizes reflection of input frequencies. When the fundamental frequency being broadcast has a wavelength that is greater than five times the length "l" of the antenna 20, termination is not typically required. Otherwise, proper termination of antenna 20 results in substantially no reflections.

Each of the radiators of antenna 20 are arranged in a vee-shaped pattern having an angle of $2\theta$ (where the angle $\theta$ the angle between one radiator and the central axis of propagation of wideband radiated signal 24). The radiators of antenna 20 arranged with the proximal portion of the antenna 20 having the radiators more closely spaced together and the distal portion of the antenna 20 having ends of the radiators spaced further apart. Angle $2\theta$ can be selected to maximize constructive interference of sidelobes radiated by each radiator along the central axis of propagation of wideband radiated signal 24.

The housing 12 of signal generator 10 includes an optional laser 26 for designating a point in an area (e.g., for targeting purposes) that is irradiated by the signal generator 10. Laser 26 is controlled by user interface 10 and powered by power unit 14. Laser 26 can be configured to produce laser beam 28 in response to the signal generator 10 being programmed to radiate power. Thus, laser 26 can also serve as a warning indicator that the signal generator is actively transmitting.

Figure 2:
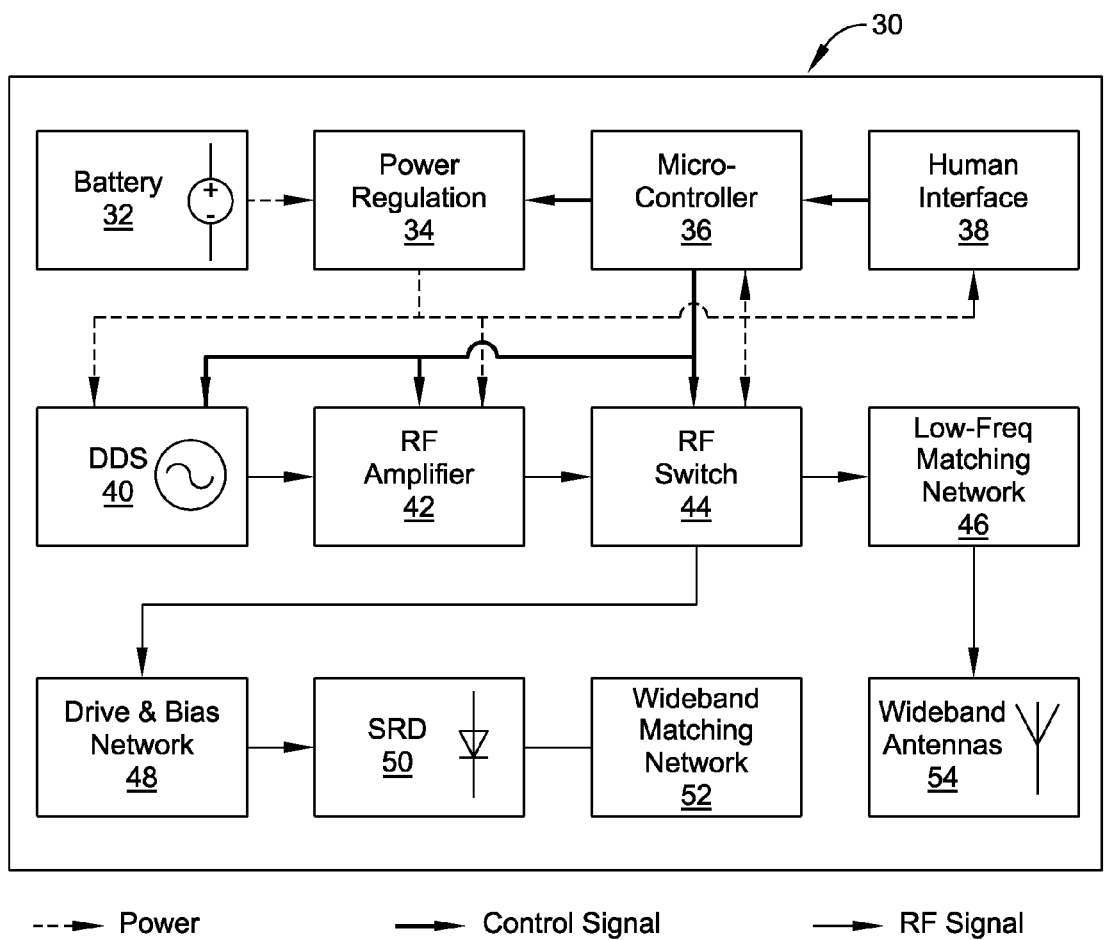
FIG. 2 is a diagram of a system implementing another embodiment of the current invention.

Referring now to FIG. 2, a diagram of another embodiment of portable wideband antenna-radiated signal generator is shown. Signal generator 30 includes a battery 32 for purposes of supplying power to electrical components of the signal generator 30. The battery 32 (as well as the other components of signal generator 30) is sized to fit with in a hand-held housing of the signal generator 30. The power output of battery 32 is coupled to power regulation circuit 34 for control and regulation.

Micro-controller 36 is arranged to provide and receive human commands to and from a human interface 38. For example, a user can use the human interface 38 to provide commands for controlling the signal generator, such as providing a command to activate (e.g., "turn on") or deactivate the signal generator 30.

Such commands are received by the micro-controller 36, which in turn (for example) sends control signals to the power regulation circuit 34 for switchably coupling power from the battery 32. The micro-controller 36 is arranged to control other components of the signal generator 30 as further described below. In various modes of operation the micro-controller 36 may offer differing test scenarios to a user (from which the user can select a particular test scenario). Each test scenario includes a list of values of various operating parameters, so that the user is not required to individually enter each of the operating parameters of a particular test scenario.

The micro-controller 36 is arranged to control DDS (direct digital synthesizer) 40 to provide a selectable fundamental frequency, which is selected from a range including for example, from DC (direct current) to a frequency above 1.5 GHz. DDS 40 typically includes a crystal oscillator reference and is programmable in real time to produce a selected frequency. The frequency of the fundamental frequency is selected, for example, in response to a command received by the user interface 38. The DDS 40 is controllably powered by power regulation circuit 34.

RF amplifier 42 is coupled to the output of DDS 40 such that the RF amplifier 42 receives a fundamental frequency signal having a frequency as programmed by the micro-controller 36. The RF amplifier is arranged to receive a command from the micro-controller 36 to specify an amount by which to amplify the received fundamental frequency signal. The RF amplifier 42 is controllably powered by power regulation circuit 34.

RF switch 44 is coupled to the output of the RF amplifier 42 to receive the amplified fundamental frequency signal. The RF switch 44 is arranged to receive a command from the micro-controller 36 to specify whether the amplified fundamental frequency signal is to be coupled to a lower frequency bypass path or a harmonic generator frequency path (which tends to act as a high-pass filter). The lower frequency bypass path is typically used when broadcast signals of the signal generator 30 have lower frequencies (e.g., from direct current to around 1.5 GHZ). Using the lower frequency bypass path when testing lower frequency responses can be used to avoid high-pass filtering (by impedance matching components such as wideband matching network 64, discussed below) of lower frequency components of the signal to be broadcast by signal generator 30.

Accordingly, low-frequency matching network 46 is arranged to receive the amplified fundamental frequency signal when the RF switch 44 is configured to couple the amplified fundamental frequency signal to the low-frequency matching network 46. The low-frequency matching network 46 is arranged to receive the amplified fundamental frequency signal in an unbalanced medium and to provide the amplified fundamental frequency signal using a medium that is balanced with respect to transmitting wide-band antennas 54.

The harmonic generator frequency path is selected when the RF switch 44 is arranged to couple the amplified fundamental frequency signal (e.g., received from the RF amplifier 42) to the drive and bias network 48. When the harmonic generator frequency path is selected, the drive and bias network is arranged to stabilize, match impedances, and drive the SRD (step recovery diode) 50. The SRD 50 is a microwave diode having steep doping profiles and relatively narrow junctions for optimizing diode charge storage. The fast recovery of injected charge for the SRD 50 provides a rapid transition period and efficiently produces a wide range of harmonics of the frequency of the amplified fundamental frequency signal. The operation of drive and bias network 48 and SRD 50 are described more fully below with respect to FIG. 3 and FIG. 4.

The wideband harmonic output of SRD 50 is coupled to wideband matching network 52. A wideband matching network 52 matches the impedance of the output of SRD 50 with the wideband antennas 54. An example of a wideband matching network 52 is described below with respect to FIG. 5 and FIG. 6. An example of wideband antennas 54 is antenna 22 that is described above with respect to FIG. 1.

Figure 3:
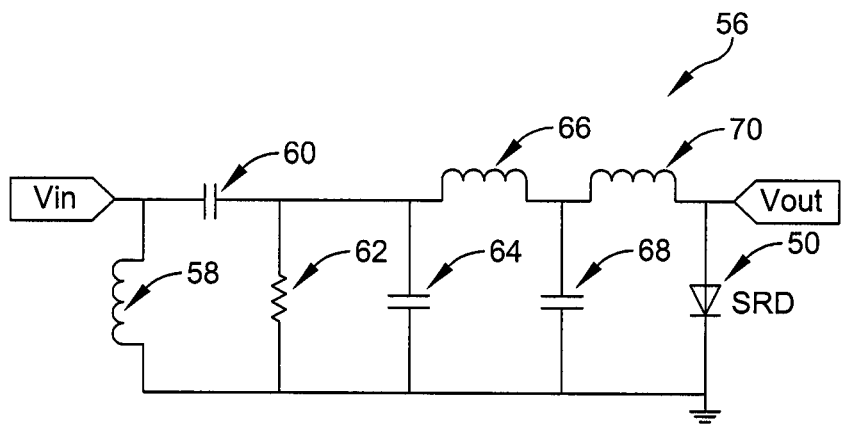
FIG. 3 is a diagram of a impedance matching and drive network for a step recovery diode of an embodiment of the current invention.

Referring now to FIG. 3, the operation of drive and bias network 48 and SRD 50 is now described. A network 56 is formed by (passive) components choke 58, capacitor 60, and resistor 62, capacitor 64, choke 66, capacitor 68, and choke 70 coupled to SRD 50. The network 56 receives an input signal that includes a fundamental frequency at node Vin and provides an output signal at node Vout that includes harmonics of the received fundamental frequency of the input signal.

The amplified fundamental frequency signal (from the RF amplifier 42, for example) is received at input node Vin. Choke 58, capacitor 60, and resistor 62 are arranged as a high-pass filter for increasing the stability of the output of the SRD 50. Resistor 62 is selected to bias the input voltage of the SRD 50. A low-pass filter is formed by capacitor 64 and choke 66 and is arranged to match the impedance of the network 56 with the source impedance of the incoming amplified frequency signal. A second low-pass filter is formed by capacitor 68 and choke 70 and is arranged to drive and enhance harmonic frequencies output by SRD 50.

Figure 4:
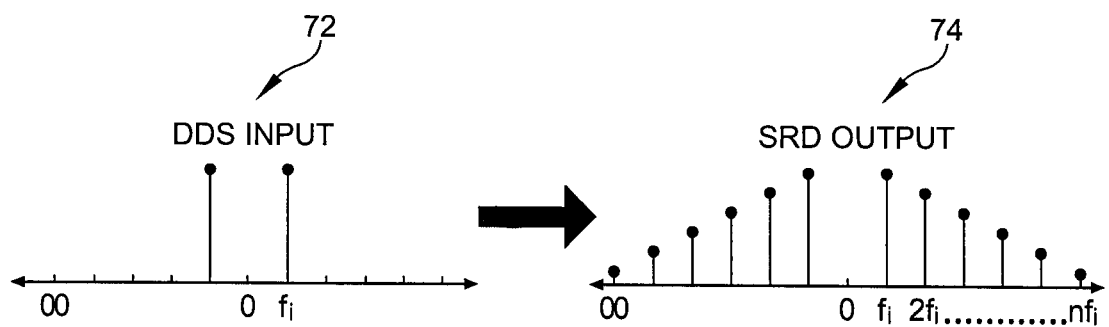
FIG. 4 is a diagram that illustrates an ideal frequency input and idealized frequency response of an embodiment of the network of FIG. 3 in accordance with the current invention.

Referring now to FIG. 4, the input and output frequency characteristics of network 56 are discussed. Plot 72 represents an idealized fundamental frequency (generated by DDS 40, for example) that is provided as an input to network 56. Plot 74 represents an idealized frequency response of network 58 to the input fundamental frequency. Plot 74 illustrates a series of harmonics of the fundamental frequency wherein the amplitude of each harmonic generally decreases with increasing distance (in frequency) of each harmonic from the input fundamental frequency. Thus, when the fundamental frequency is adjusted (by changing a controllable input of DDS 40, for example), the spacing and location of the illustrated harmonics vary in response to the change of the fundamental frequency. The output of network 56 is typically coupled to a wideband matching network, such as balun 20.

Figure 5:
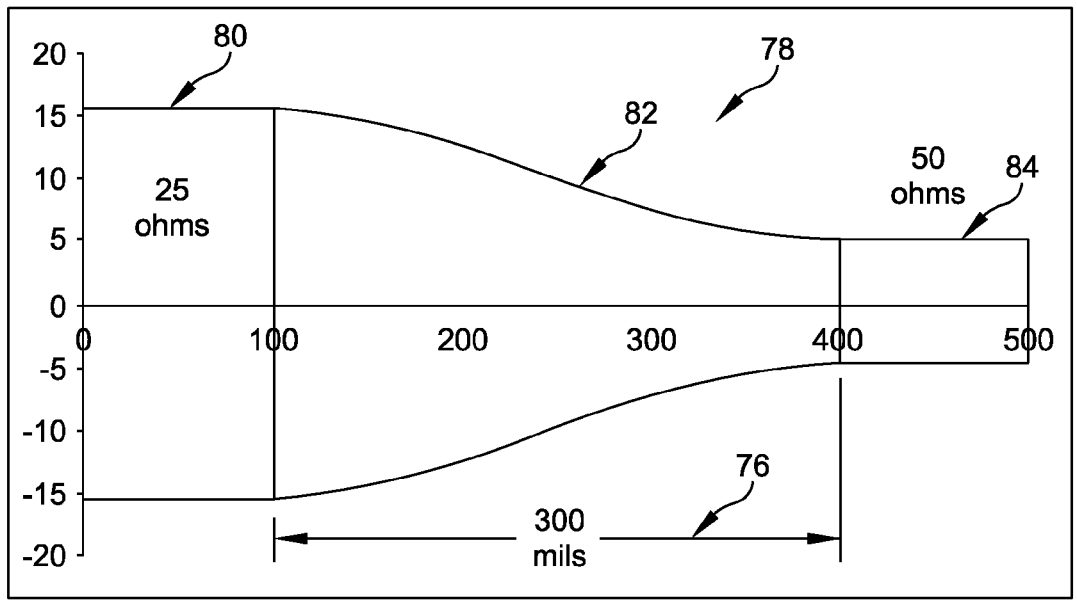
FIG. 5 is a diagram of a tapered micro-stripline of an embodiment of the current invention.

Referring now to FIG. 5, a wideband matching network for matching the output impedance of a harmonic generator to an input impedance of a wideband antenna is discussed. Wideband matching network 56 is illustrated as a (passive) tapered micro-stripline 78. Tapered micro-stripline 78 includes an input section 80, the tapered/middle section 82, and an output section 84. Input (proximal) section 80 has a characteristic impedance of around 25 ohms and is about 30 mils wide. Tapered/middle section 82 has a length 76 that extends about 300 mils lengthwise and has a width that gradually tapers over the 300 mil distance of about 30 mils wide to about five mils wide. Output (distal) section 84 has a characteristic impedance of around 50 ohms and is about five mils wide. Thus, the characteristic impedance of tapered micro-stripline 78 gradually varies from input impedance of 25 ohms to an output impedance of 50 ohms across the length 76 of the middle section 82. The frequency response of the tapered micro-stripline 78 is now discussed with reference to FIG. 6.

Figure 6:
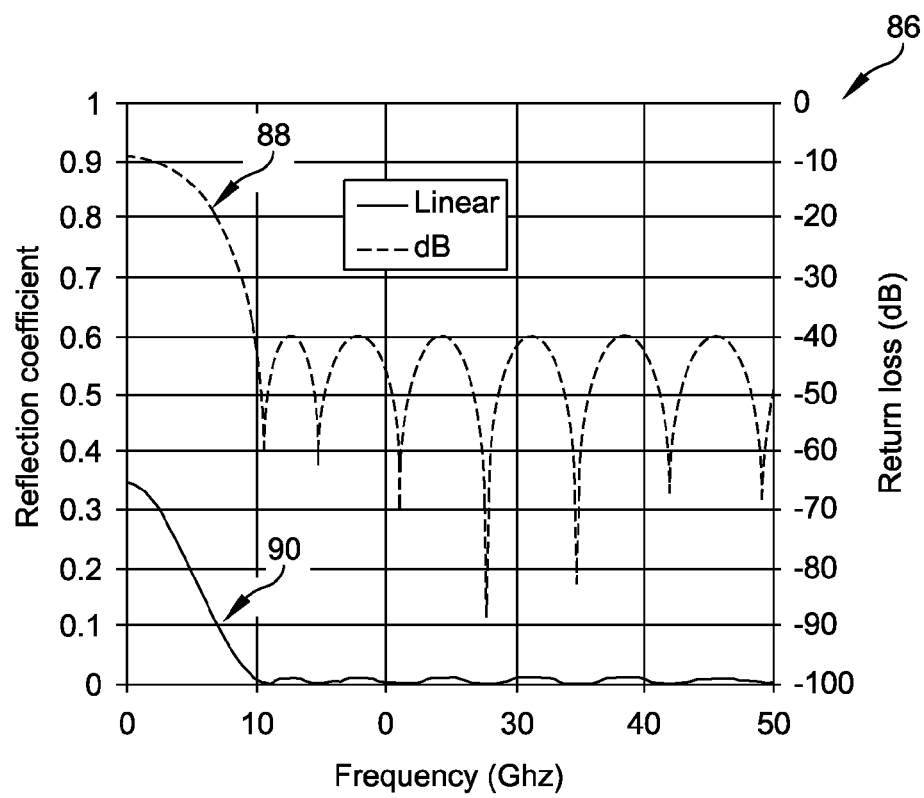
FIG. 6 is a diagram that illustrates a frequency response of the an embodiment of the tapered micro-stripline of FIG. 5 in accordance with the current invention.

FIG. 6 illustrates the frequency response of the tapered micro-stripline as illustrated in FIG. 5. Plot 86 generally illustrates a frequency response of the tapered micro-stripline 78 over a range input frequencies extending from direct current (DC) to 50 GHz. For example, a response such as "return loss" in dB is illustrated using curve 88 and a "reflection coefficient" (as a linear function) is illustrated using curve 90. The response to frequencies higher than the illustrated 50 GHz are similar to the responses illustrated in the 10-50 GHz portion of plot 86. In particular, the maximum amplitudes for input frequencies greater than around 10 GHz (theoretically) maintains a value of around −40 dB as the input frequencies extended towards infinity. Thus, the tapered micro-stripline is arranged to efficiently transmit higher frequencies without appreciable "roll-off" (e.g., progressively higher attenuation of higher frequencies) of the higher-end harmonics produced by an SRD such as SRD 50.

Figure 7:
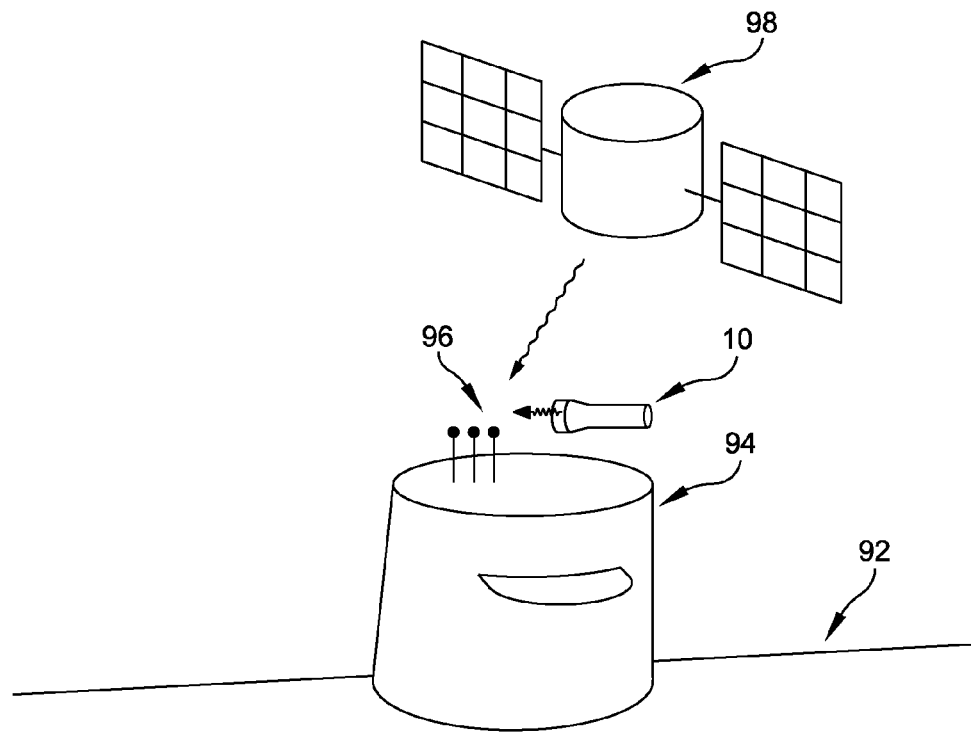
FIG. 7 is a diagram of a system implementing a further embodiment of the current invention.

FIG. 7 illustrates testing of a communication system using a portable wideband antenna-radiated signal generator. Vessel 92 includes a relatively inaccessible area such as a sail area 94, wherein the sail area 94 includes components of a communication system that are to be tested. The components include visible components (such as an antenna 96) and hidden components (such as cabling and transceivers, not shown). A portable wideband antenna-radiated signal generator (such as signal generator 10) is used to externally irradiate antenna 96 for testing (for example) continuity from the antenna 96 to a transceiver within the vessel 92. The signal generator 10 is typically used at location that is proximate to the sail and is around 3 meters distance from a target antenna. The signal generated by signal generator 10 can be measured using equipment coupled to components of the communication system within vessel 92. Thus, the signal generator 10 can be used to easily and efficiently test components of a communication system, even when components of the communication system are included in a relatively inaccessible area. Likewise, the signal generator 10 can be used to easily and efficiently test components of the communication system even when relatively expensive assets (such as non-hand-portable test equipment and/or satellite communications) are not available or relatively costly to use.

Additionally, the signal generator 10 can be used to perform signal-to-ratio (SNR) tests in conjunction with available communication system assets. For example, a satellite 98 can establish a communication session with a transceiver aboard vessel 92 via antenna 96. A user can, for example, select a fundamental frequency or frequency spacing (such as the "comb" spacing of harmonics) and power level for a signal to be transmitted from the signal generator 10. (As discussed above, a user can select a test scenario, which then selects test parameters appropriate for programming operational parameters of the signal generator 10 to act as a signal generator for a particular test scenario.) The level of the power output of the signal generator 10, the distance of the signal generator 10 to the antenna 96, the frequency and/or frequency spacing of the output power of the signal generator 10, and the measured strength of a signal from the satellite 98 can be used to determine the SNR response of the communication system.

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A wideband harmonic signal generator comprising:
a programmable frequency generator for generating a signal having a selected fundamental frequency;
a harmonic series generator arranged to receive the signal having the selected fundamental frequency and to produce a signal having a harmonic series, wherein the harmonic series includes harmonics of the selected fundamental frequency;
a wideband impedance matching network that is arranged to receive the signal having the harmonic series and to transfer the signal having the harmonic series using a balanced impedance output;
a directional antenna having a characteristic impedance that is matched to the balanced impedance output and that is arranged to receive and directionally transmit the transferred signal having the harmonic series;
a housing that is arranged as a hand-held assembly to which the programmable frequency generator, the harmonic series generator, the wideband impedance matching network, and the directional antenna are mounted; and
an RF switch having an input that is coupled to receive the signal having a selected fundamental frequency, the RF switch arranged to couple the input to a first output that is selectively coupled to the directional antenna when a bypass path is selected, and the RF switch arranged to selectively couple the input to a second output that is coupled the harmonic series generator when a harmonic generator frequency path is selected.

2. The device in accordance with claim 1 further comprising:
a human interface arranged to receive an operating instruction from a user holding the housing.

3. The device in accordance with claim 1 further comprising:
a human interface arranged to select the fundamental frequency in response to an operating instruction from a user holding the housing.

4. The device in accordance with claim 1 further comprising:
a controller arranged to select the output power of the directionally transmitted signal having the harmonic series in response to an operating instruction from a user holding the housing.

5. The device in accordance with claim 1 further comprising:
a radio frequency (RF) amplifier that is coupled between a direct digital synthesizer and a RF switch, wherein the radio frequency amplifier is arranged to amplify the signal having the harmonic series in accordance with a user input command.

6. The device in accordance with claim 1 further comprising:
a drive and bias network that is coupled between the programmable frequency generator and the harmonic series generator, wherein the drive and bias network includes a first choke, first capacitor, and first resistor arranged as a high-pass filter to increase the stability of the output of the harmonic series generator and to bias the input voltage of the harmonic series generator.

7. The device in accordance with claim 6 wherein the harmonic series generator is arranged as a step recovery diode (SRD).

8. The device in accordance with claim 1 further comprising:
a laser that is arranged to designate an area irradiated by the directionally transmitted signal having the harmonic series.

9. The device in accordance with claim 1 further comprising:
a battery that is arranged to provide power for operating the programmable frequency generator.

10. The device in accordance with claim 1 wherein the directional antenna is a vee-shaped dipole traveling wave antenna that is arranged at least partially within a housing generator.

11. The device in accordance with claim 1 wherein the wideband impedance matching network is a tapered microstripline having an input impedance of a first impedance, and output impedance of a second impedance that is different from the first impedance, and a tapered section having an impedance that ranges from the first impedance to the second impedance as a function of length.

12. A wideband harmonic signal generator comprising:
a programmable frequency generator for generating a signal having a selected fundamental frequency;
a harmonic series generator arranged to receive the signal having the selected fundamental frequency and to produce a signal having a harmonic series, wherein the harmonic series includes harmonics of the selected fundamental frequency;
a wideband impedance matching network that is arranged to receive the signal having the harmonic series and to transfer the signal having the harmonic series using a balanced impedance output;
a directional antenna having a characteristic impedance that is matched to the balanced impedance output and that is arranged to receive and directionally transmit the transferred signal having the harmonic series;
a housing that is arranged as a hand-held assembly to which the programmable frequency generator, the harmonic series generator, the wideband impedance matching network, and the directional antenna are mounted; and
a drive and bias network that is coupled between the programmable frequency generator and the harmonic series generator, wherein the drive and bias network includes a first choke, first capacitor, and first resistor arranged as a high-pass filter to increase the stability of the output of the harmonic series generator and to bias the input voltage of the harmonic series generator, wherein the drive and bias network includes a first low-pass filter that is formed by a second capacitor and a second choke that is arranged to match the impedance of the drive and bias network with a source impedance of the signal having the harmonic series.

13. A wideband harmonic signal generator comprising:
a programmable frequency generator for generating a signal having a selected fundamental frequency;
a harmonic series generator arranged to receive the signal having the selected fundamental frequency and to produce a signal having a harmonic series, wherein the harmonic series includes harmonics of the selected fundamental frequency;
a wideband impedance matching network that is arranged to receive the signal having the harmonic series and to transfer the signal having the harmonic series using a balanced impedance output;

a directional antenna having a characteristic impedance that is matched to the balanced impedance output and that is arranged to receive and directionally transmit the transferred signal having the harmonic series;

a housing that is arranged as a hand-held assembly to which the programmable frequency generator, the harmonic series generator, the wideband impedance matching network, and the directional antenna are mounted; and a drive and bias network that is coupled between the programmable frequency generator and the harmonic series generator, wherein the drive and bias network includes a first choke, first capacitor, and first resistor arranged as a high-pass filter to increase the stability of the output of the harmonic series generator and to bias the input voltage of the harmonic series generator, wherein the drive and bias network includes a second low-pass filter is formed by a third capacitor and a third choke that is arranged to drive and enhance harmonic frequencies output by harmonic series generator.

\* \* \* \* \*